(12) United States Patent
Nishimura (10) Patent No.: US 7,541,951 B2
(45) Date of Patent: Jun. 2, 2009

(54) TRACKING LOOP TYPE DIGITAL ANGLE CONVERTER AND ANGLE/DIGITAL CONVERTING APPARATUS

(75) Inventor: Hisashi Nishimura, Tokyo (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 0 days.

(21) Appl. No.: 12/072,338

(22) Filed: Feb. 25, 2008

(65) Prior Publication Data

US 2008/0218391 A1    Sep. 11, 2008

(30) Foreign Application Priority Data

Mar. 7, 2007 (JP) .............................. 2007-057261

(51) Int. Cl.
*H03M 1/48* (2006.01)

(52) U.S. Cl. ........................................ 341/116; 702/85

(58) Field of Classification Search ................. 341/116, 341/112, 115, 155; 702/85; 318/560
See application file for complete search history.

(56) References Cited

U.S. PATENT DOCUMENTS 4,591,269 A * 5/1986 Mohr .......................... 356/460
5,517,689 A * 5/1996 Hayashihara ............... 455/205

2004/0107586 A1 * 6/2004 Nakamura et al. .......... 33/1 PT
2008/0172202 A1 * 7/2008 Nakazato .................... 702/151

FOREIGN PATENT DOCUMENTS

| EP | 0902543 A2 | 3/1999 |
|---|---|---|
| EP | 1059731 A2 | 12/2000 |
| EP | 1199808 A2 | 4/2002 |
| JP | 2000-353957 | 12/2000 |

OTHER PUBLICATIONS

EP Extended Search Report, Jul. 16, 2008.

* cited by examiner

*Primary Examiner*—Peguy JeanPierre
(74) *Attorney, Agent, or Firm*—David N. Lathrop, Esq.; Gallagher & Lathrop (57) ABSTRACT

A tracking loop type digital angle converter that operates so that a deviation between input and output angles always becomes zero by feeding back the output angle to the input angle, wherein in order to eliminate a case where a control deviation decreases an angle error between the input and output angles is in the vicinity of 180°, i.e., where response becomes low, there are provided a detected signal sign judging section (41) that judges signs of rotation detection signals to determine a quadrant where the input angle exists, and an output angle correcting section (42) for comparing an angle region of the output angle and the quadrant of the input angle to detect a state where the angle error is excessive, judging that the control response is low and carrying out a process for compensating the output angle.

4 Claims, 8 Drawing Sheets

| REGION $\phi$ | QUADRANT OF $\theta$ JUDGED TO BE EXCESSIVE ANGLE ERROR |
|---|---|
| $-45° \leq \phi < +45°$ | II |
| | III |
| $+45° \leq \phi < +135°$ | III |
| | IV |
| $+135° \leq \phi < +225°$ | I |
| | IV |
| $+225° \leq \phi < +315°$ | I |
| | II |

TRACKING LOOP TYPE DIGITAL ANGLE CONVERTER AND ANGLE/DIGITAL CONVERTING APPARATUS

TECHNOLOGICAL FIELD

The present invention relates to a tracking loop type digital angle converter and an angle/digital converting apparatus for obtaining a digital angle output from analog rotation detection signals $f(t)\sin\theta$ and $f(t)\cos\theta$ obtained from a rotation detector and more specifically to a tracking loop type digital angle converter and an angle/digital converting apparatus having a function capable of avoiding a drop-down of a loop response that otherwise occurs due to an angular transition by which an angle error $(\theta-\phi)$ becomes close to 180° and a control deviation becomes small even though an error is large in a control system in which the control deviation is represented by $\sin(\theta-\phi)$.

BACKGROUND ART

A resolver/digital converter (RD converter) is generally used in a way of detecting rotation of a rotation detector connected to an object to be monitored as rotation detection signals, of converting the rotation detection signals into angle values and of outputting angular position of the object to be monitored by digitalized angle values.

Figure 8:
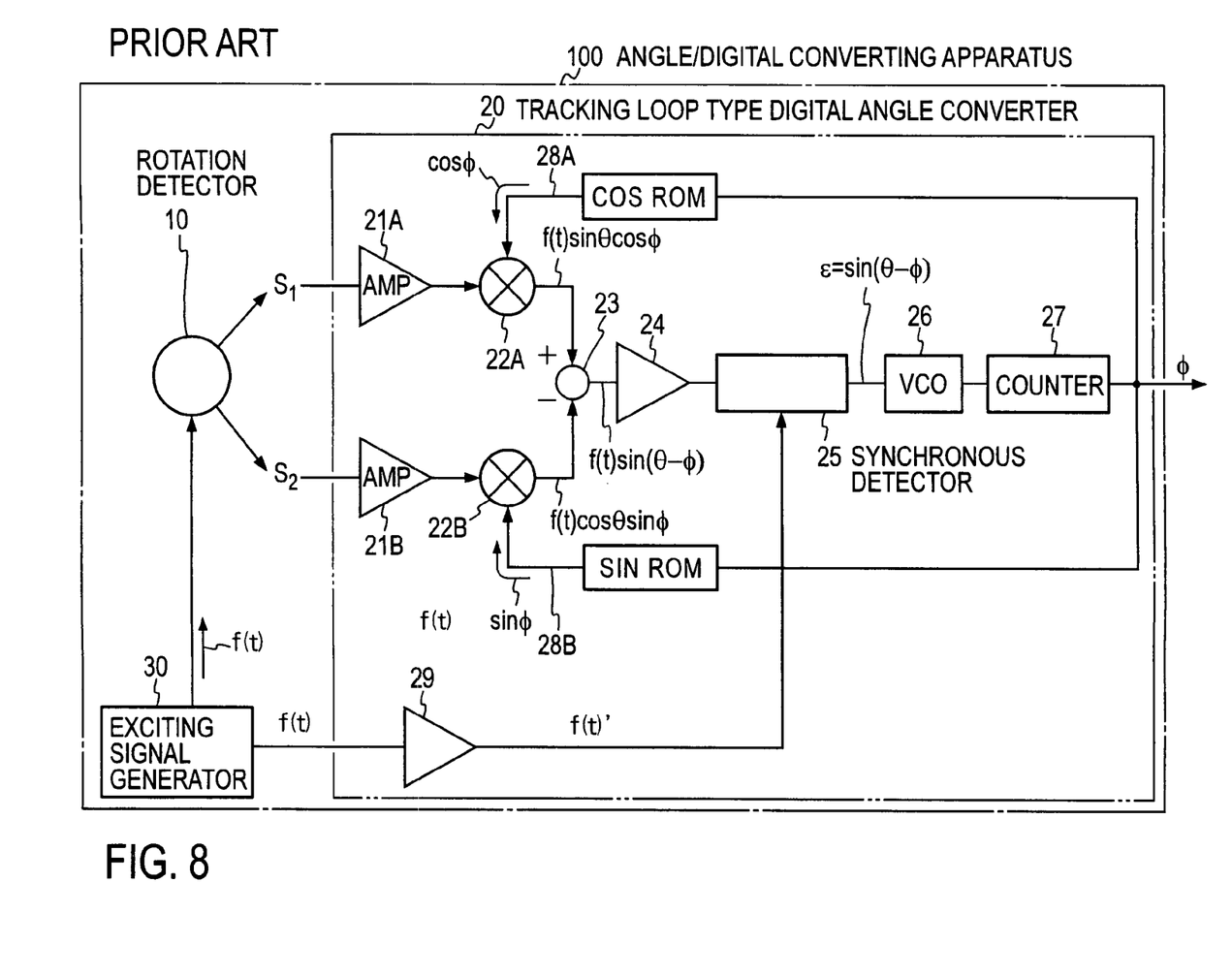
FIG. 8 is a block diagram for explaining a prior art technology.

FIG. 8 shows a prior art angle/digital converting apparatus 100. The angle/digital converting apparatus 100 is basically composed of a rotation detector 10, a tracking type R/D converter 20 and an exciting signal generator 30.

The exciting signal generator 30 outputs an exciting signal $f(t)=\sin\omega t$, a periodic function where t represents time and $\omega$ represents an angular velocity, to excite the rotation detector 10. Beside that, it shapes a waveform of the exciting signal $f(t)=\sin\omega t$ and supplies it to a synchronous detector 25 provided in the tracking type R/D converter 20 as a reference signal $f(t)'$. It is noted that a waveform shaper 29 shapes the waveform of the exciting signal $f(t)$ into a rectangular reference signal $f(t)'$. Accordingly, the reference $f(t)'$ has the same period $2\pi/\omega$ as that of the exciting signal $f(t)$.

The rotation detector 10 outputs two quadrature rotation detection signals $S_1=f(t)\sin\theta$ and $S_2=f(t)\cos\theta$ and inputs the quadrature rotation detection signals $S_1$ and $S_2$ into the tracking type R/D converter 20.

The tracking type R/D converter 20 arithmetically operates the quadrature rotation detection signals $S_1$ and $S_2$ to output an output angle signal $\phi$. The output angle signal $\phi$ is negatively fed back to the input side so as to control that the relationship between the output angle signal $\phi$ and the input angle signal $\theta$ of the tracking type R/D converter 20 is kept to be $\theta=\phi$.

That is, the tracking type R/D converter 20 multiplies the quadrature rotation detection signals $S_1=f(t)\sin\theta$ and $S_2=f(t)\cos\theta$ with the feedback signals $\cos\phi$ and $\sin\phi$ from feedback loops 28A and 28B by multipliers 22A and 22B to obtain $f(t)\sin\theta\cos\phi$ and $f(t)\cos\theta\sin\phi$. Then, a subtractor 23 subtracts them from each other to obtain a subtracted value $f(t)\sin(\theta-\phi)$. A synchronous detector 25 synchronously detects this subtracted value to produce a signal $\sin(\theta-\phi)$ as a control deviation $\epsilon=\sin(\theta-\phi)$ in which the exciting signal component $f(t)$ has been removed. The tracking type R/D converter 20 inputs this control deviation $\epsilon$ to a voltage controlled oscillator 26 to convert into a pulse train having a frequency corresponding to the value of the control deviation $\epsilon$. A counter 27 counts this pulse train and outputs its counted value as an output angle $\phi$. The RD converter operated with this angle/digital conversion method is called as a tracking type R/D converter in general as disclosed in Japanese Patent Application Laid-Open No. 2000-353957 for example.

The voltage controlled oscillator 26 outputs positive pulses when the synchronously detected output of the synchronous detector 25 is positive and outputs negative pulses when the synchronously detected output is negative in this tracking type R/D converter. The counter 27 is composed of an up/down counter and counts up while the positive pulses are inputted and counts down while negative pulses are inputted.

The control deviation $\epsilon$ becomes 0 in a state in which the input angle $\theta$ and the output angle $\phi$ outputted from the counter 27 hold $\theta=\phi$ and an equilibrium state is kept in this state. When the input angle $\theta$ changes to $\theta'$ in the equilibrium state, the control deviation $\epsilon$ becomes $\epsilon\neq 0$ and the voltage controlled oscillator 26 outputs positive or negative pulses in accordance to the polarity of the control deviation $\epsilon$. The counter 27 counts that pulses and the control deviation $\epsilon$ becomes $\epsilon=0$, i.e., the equilibrium state, at a point of time when the output angle $\phi$ reaches to a relationship of $\phi=\theta'$. Thus, the tracking type R/D converter 20 outputs an output angle $\phi$ that varies following the input angle $\theta$.

The basis of the tracking loop method that converts the analog rotation detection signals into the digital angle is that it uses $\sin(\theta-\phi)$ as the control deviation $\epsilon$ as described above and this is not exceptional also in case of Japanese Patent Application Laid-Open No. 2000-353957. Although it is possible to zero the target deviation between the input angle $\theta$ and the output angle $\phi$ by controlling so as to render $\sin(\theta-\phi)$ to zero, a zero point also exists at $\theta-\phi=180°$ besides the zero point at $\theta-\phi=0$ according to the characteristics of the sin function. The tracking loop becomes stable in the state of $\theta-\phi=180°$ because the control deviation $\epsilon$ is zero even though an angle error between the input angle $\theta$ and the output angle $\phi$ is maximum. Therefore, there has been a problem that when large changes of the input angle occur in a short time, the control deviation $\epsilon$ becomes small and a control response drops when the angle error $(\theta-\phi)$ approaches the vicinity of 180° even though the angle error is large. In a worst case, a serious drawback is brought about when the object to be monitored stops in a state when the rotation angle has changed by 180° at speed exceeding the control response such that the object is left in a hang-up state having this angle deviation.

SUMMARY OF THE INVENTION

In order to eliminate the drawbacks described above, it is an object of the invention to provide a tracking loop type digital angle converter and an angle/digital converting apparatus realizing high convergence without causing a drop down of response even in a case where a control deviation becomes small even though the angle error is excessive.

The tracking loop type digital angle converter of the invention comprises multiplying means for calculating $S_1\cos\phi$ and $S_2\sin\phi$ from the rotation detection signals $S_1$ and $S_2$ and the output signal $\phi$, subtracting means for calculating a difference $S_1\cos\phi-S_2\sin\phi=f(t)\sin(\theta-\phi)$ between these multiplication results, synchronous detecting means for synchronously detecting the difference $f(t)\sin(\theta-\phi)$ to obtain a control deviation $\epsilon=\sin(\theta-\phi)$, a voltage controlled oscillator for generating pulses of a frequency corresponding to the control deviation $\epsilon$, a counter for counting the output pulses of the voltage controlled oscillator to produce an output angle $\phi$, trigonometric function value generating means for outputting $\cos\phi$ and $\sin\phi$ corresponding to the output angle $\phi$ and negatively feeding back to the multiplying means, a detected signal sign judging section for receiving the rotation detection signals $S_1$ and $S_2$ and judging plus and minus signs of sin θ of the rotation detection signal $S_1$ and cos θ of the signal $S_2$ and an output angle correcting section for detecting a quadrant of the input angle θ from the signs of sin θ and cos θ outputted from the detected signal sign judging section, detecting an angle error between θ and φ, deciding whether or not the angle error is larger than a predetermined value, and if so, phase-shifting the output angle φ by 180°.

According to the prior art angle/digital converter constructed as shown in FIG. 8, the control deviation sin(θ−φ) decreases even though the error increases when a difference between input and output angles exceeds 90° and reaches a singularity point of the control when the difference becomes 180°. In contrary to that, according to the tracking loop type digital angle converter of the invention constructed as described above, it is possible to enhance the control response because the converter of the invention brings the error closer toward 90° when the angle error is in a range of 90° to 180°. That is, the tracking loop type digital angle converter compares the quadrant of the input angle θ with the output angle φ and when an angle range indicated by the quadrant of the input angle θ does not coincide with the output angle, the output angle correcting section displaces the output angle φ by 180° based on the judgment that the deviation is close to the singularity point of control (the control response is dropping). The displacement of 180° of the output angle φ may be carried out by inverting the most significant bit of the counter. As a result, it becomes possible to shift the converter always to an angle deviation state that quickens the convergence.

BEST MODE FOR CARRYING OUT THE INVENTION

An angle/digital converting apparatus of the invention also carries out a calculation of $S_1 \cos φ − S_2 \sin φ$ using rotation detection signals $S_1 = f(t) \sin θ$ and $S_2 = f(t) \cos θ$ of an input angle θ from a rotation detector excited by an exciting signal f(t)=sin ωt, i.e., periodic function, and obtains a control deviation ε=sin(θ−φ) by synchronously detecting the calculation result f(t)sin(θ−φ) in the same manner with the prior art technology shown in FIG. 8. The converting apparatus inputs the control deviation ε to a voltage controlled oscillator and a counter counts output pulses from the voltage controlled oscillator to obtain an output signal φ. The output signal φ is negatively fed back to the rotation detection signals $S_1$=f(t)sin θ and $S_2$=f(t)cos θ. A tracking loop type digital angle converter of the invention is provided also with an angular quadrant compensating section composed of a detected signal sign judging section for judging plus and minus signs of sin θ of the rotation detection signal $S_1$ and cos θ of the rotation detection signal $S_2$ from the inputted rotation detection signals $S_1$ and $S_2$ and an output angle correcting section for judging a quadrant where the input angle θ exists from the signs of the sin θ and cos θ outputted from the detected signal sign judging section and the output signal φ, comparing the quadrant with an angle range where the output signal φ exists and inverting a logical value of a most significant bit of a digital sign representing the output signal φ outputted from the counter at the point of time when an excessive angle error is detected.

EMBODIMENT

Figure 1:
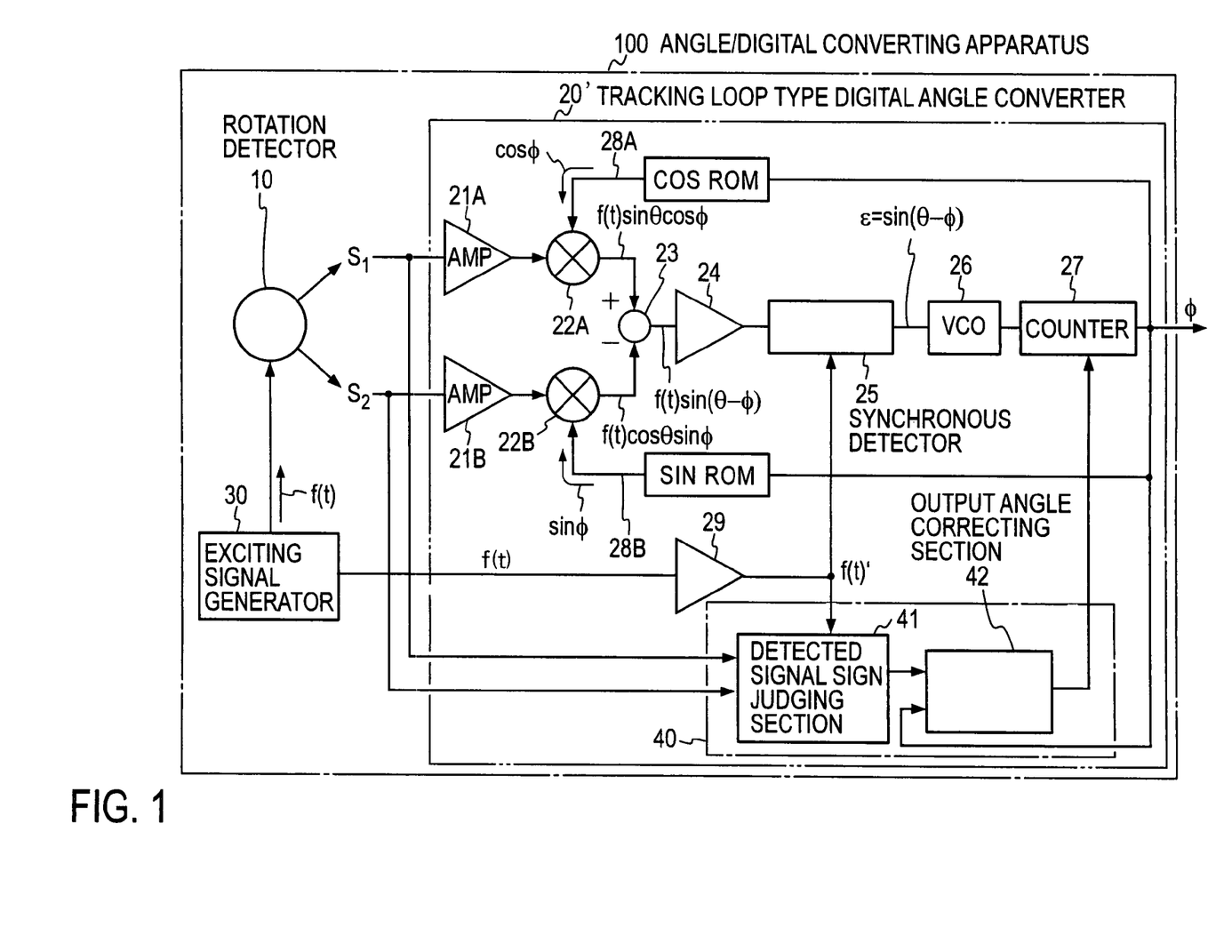
FIG. 1 is a block diagram for explaining one embodiment of the invention.

FIG. 1 shows an embodiment of an angle/digital converting apparatus 100 and a tracking loop type digital angle converter 20' (referred to simply as a RD converter 20' hereinafter). The same reference numerals refer to those corresponding in FIG. 8 and an overlapped explanation thereof will be omitted here.

The characteristic structure of the invention is that the RD converter 20' is provided with an angular quadrant compensating section 40 therein. The angular quadrant compensating section 40 is composed of a detected signal sign judging section 41 and an output angle correcting section 42.

The detected signal sign judging section 41 receives the rotation detection signals $S_1$=f(t)sin θ and $S_2$=f(t)cos θ, and judges plus and minus signs of sin θ and cos θ in the rotation detection signals $S_1$ and $S_2$, respectively. The output angle correcting section 42 determines the quadrant where the input angle θ exists based on the signs of sin θ and cos θ in the signals $S_1$ and $S_2$, compares the quadrant with the angle range where the output signal φ exists and judges that control response is low when the angle error is excessive.

Figure 2:
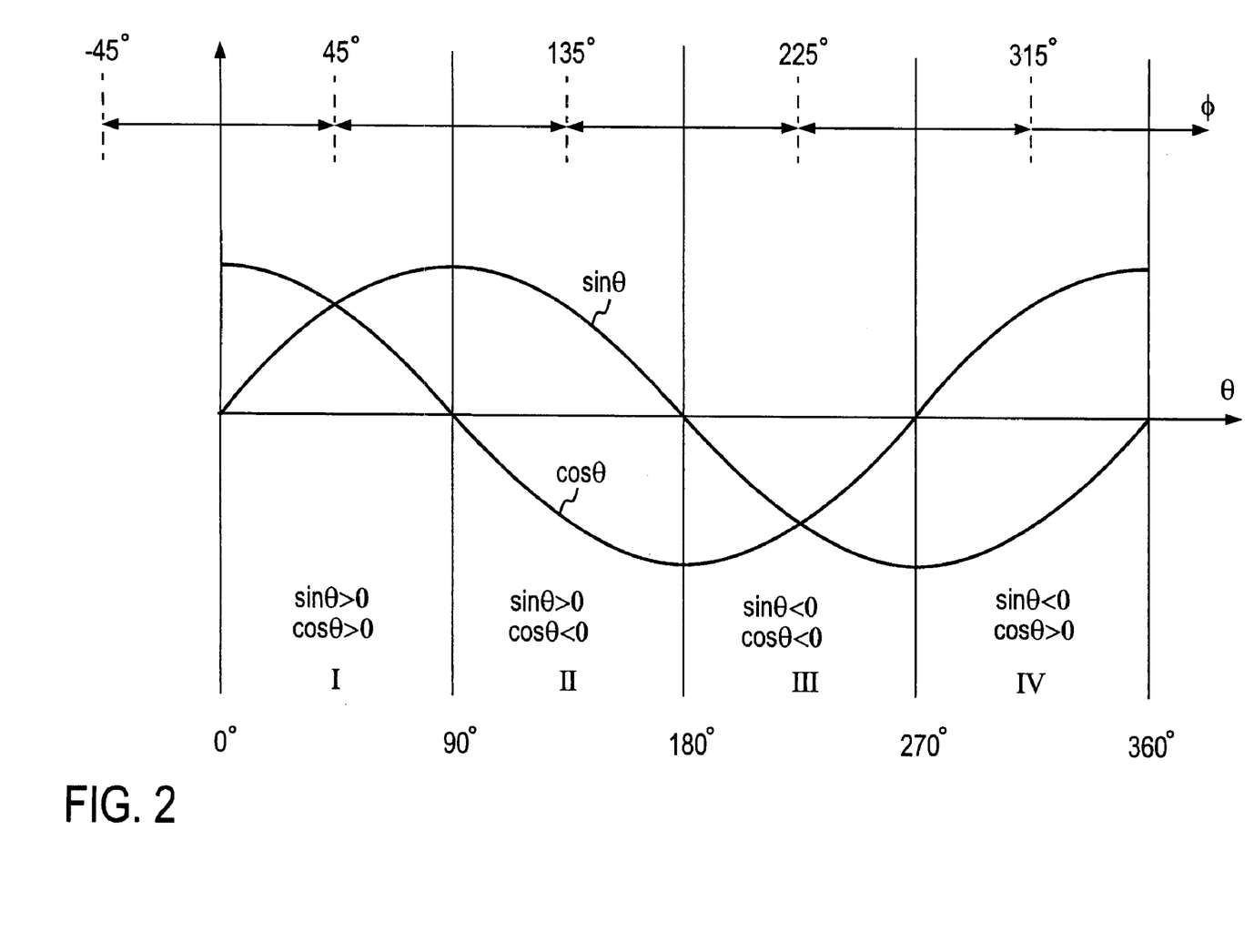
FIG. 2 is a chart for explaining a quadrant judging method used in the embodiment of the invention.
Figure 3:
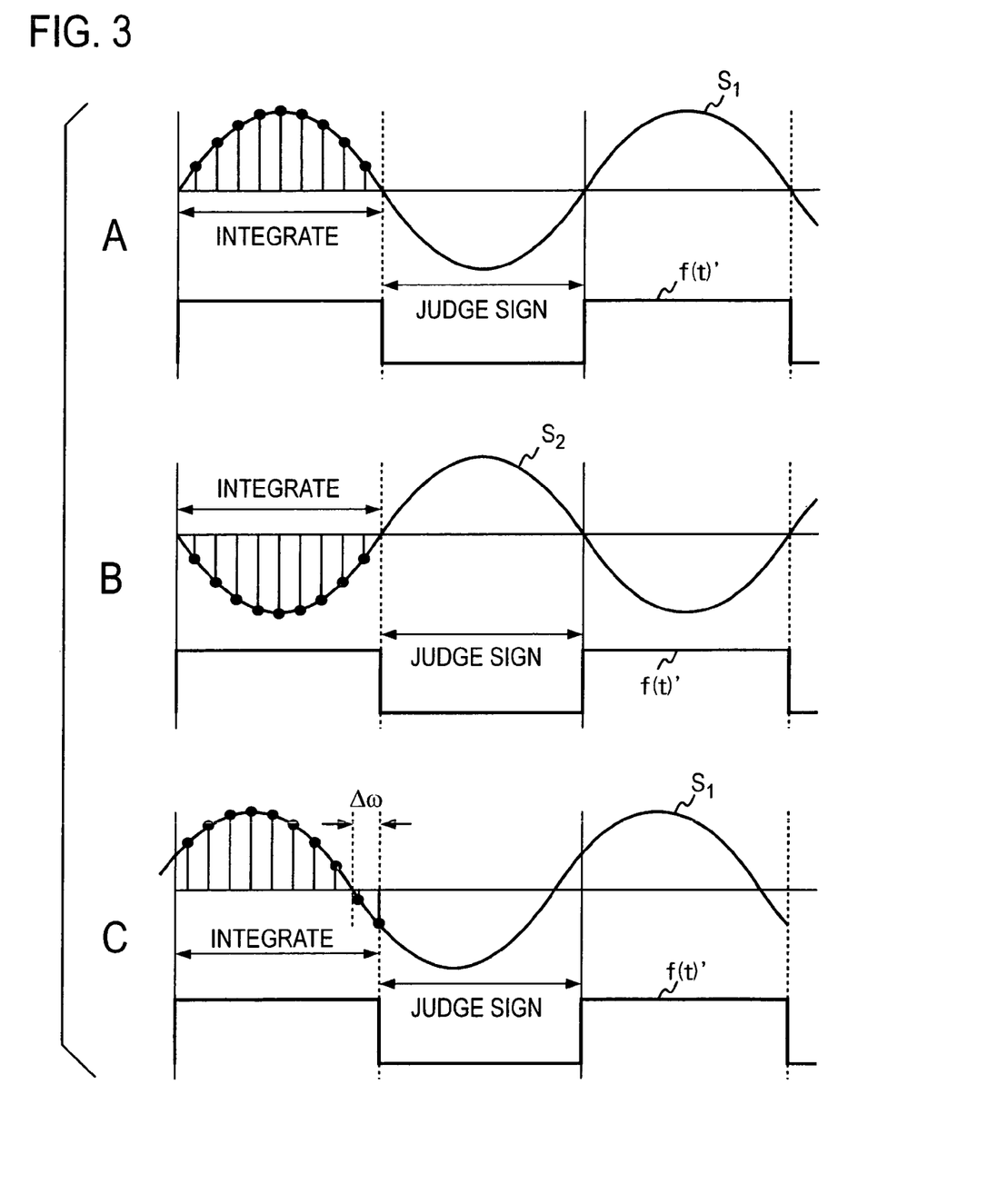
FIG. 3 shows waveform charts for explaining a method for detecting signs of the rotation detection signals used in the embodiment of the invention.

It is possible to determine the quadrant uniquely from a combination of the signs of sin θ and cos θ as shown in FIG. 2. sin θ>0 and cos θ<0 when θ exists in the second quadrant II for example, so that assuming f(t)=sin ωt, the waveforms of f(t)sin θ and f(t)cos θ would have polarities inverted from each other as shown in FIGS. 3A and 3B. Then, it becomes possible to determine the signs of sin θ and cos θ by integrating the rotation detection signals f(t)sin θ and f(t)cos θ respectively during a logic H (or logic L) period which is a half-period of the reference signal f(t)' and by reading the signs of the respective integrated values at a point of time in the subsequent half-period. That is, the signals sin θ and cos θ are integrated in the period of logic H of the reference signal f(t)' and the signs are determined when the reference signal f(t)' enters the period of the logic L (or logic H) as shown in FIGS. 3A and 3B.

Although the exciting signal f(t) outputted from the exciting signal generator 30 generally has a phase difference Δω with the rotation detection signals f(t)sin θ and f(t)cos θ obtained through the rotation detector 10, it is possible to determine the signs correctly by sampling the integrated values through the period of the logic H of the reference signal f(t)' even if the reference signal f(t)' has the certain degree of phase difference Δω relative to f(t)sin θ and f(t)cos θ as shown in FIG. 3C.

Figure 4:
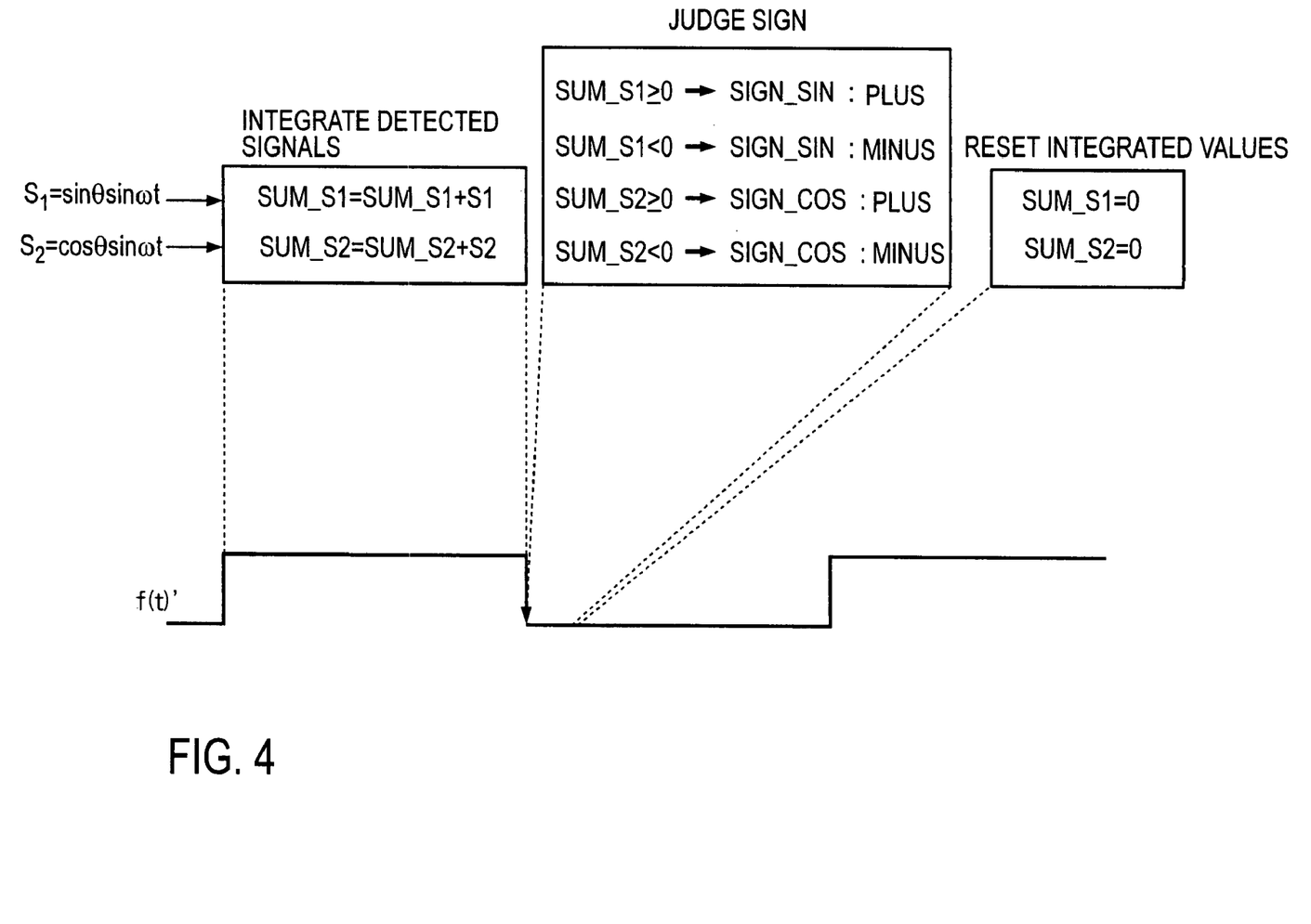
FIG. 4 is a chart for explaining a state of a process for judging the signs of the rotation detection signals used in the embodiment of the invention.

FIG. 4 shows a state of the integration of the rotation detection signals and the process for determining the signs of sin θ and cos θ, where it is assumed as f(t)=sin ωt.

$SUM\_S_1=SUM\_S_1+S_1$ and $SUM\_S_2$. $SUM\_S_2+S_2$ indicate integration of the rotation detection signals $S_1$ and $S_2$. Still more, the following process shows the procedure for determining the signs from the integration results.

Set 0 in the SIGN_SIN flag when $SUM\_S_1 \geqq 0$.
Set 1 in the SIGN_SIN flag when $SUM\_S_1 \leqq 0$.
Set 0 in the SIGN_COS flag when $SUM\_S_2 \geqq 0$.
Set 1 in the SIGN_COS flag when $SUM\_S_2 \leqq 0$.

The SIGN_SIN flag and the SIGN_COS flag are passed to the output angle correcting section 42. Besides, the SIGN_SIN flag and the SIGN_COS flag, the output angle correcting section 42 receives the output angle φ to compare the quadrant of the output angle φ with the input angle θ. If the value of sin θ or cos θ is close to zero, i.e., when the input angle θ is 0°, 90°, 180° or 270° that is a boundary of the quadrants, there is a case where the quadrant of θ does not coincide with that of φ when noise superimposed on the rotation detection signals f(t)sin θ and f(t)cos θ is taken into consideration. Therefore, the realm of angle φ is divided at fixed intervals forming successive regions each straddling over the halves of two adjacent quadrants as indicated by −45° to 45°, 45° to 135°, 135° to 225° and 225° to 315° in FIG. 2 and it is decided which one of the two quadrants straddled by the region of the detected output angle φ, the input angle θ resides in.

If θ exists in either one of the two quadrants straddled by the region where the detected output angle φ belongs, the angle error (θ−φ) exists in a range where the response of the tracking loop (feedback loop) is high and if θ exists in a quadrant other than those two quadrants, the angle error is excessive (i.e., larger than a predetermined value) and exists in a range where the response of the tracking loop is low.

Figure 5:
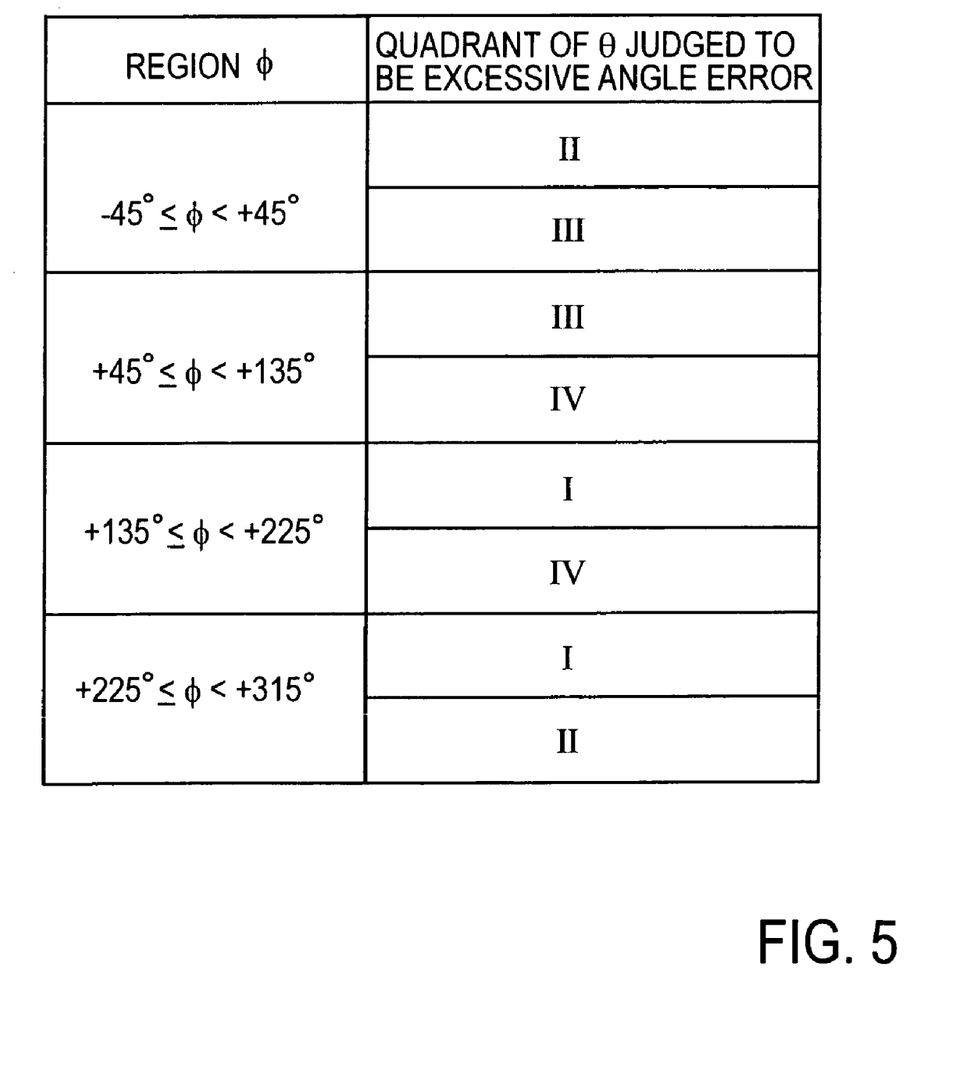
FIG. 5 is a table showing quadrants of input angles θ that enables an angle error to be excessive with respect to a region of the output angle φ used in the embodiment of the invention.

FIG. 5 shows the relationships of the quadrants of the input angle θ with respect to the regions of the output angle φ for which the angle error is determined excessive. When the angle error is excessive, it is judged that the angle error exists in a range where the control response is low and the process for correcting the output angle φ is carried out. There is a case where the judging condition described above may momentarily hold due to external noise. Then, higher reliability may be obtained by executing the correcting process by judging that the angle error is excessive when the above judging condition continues for a predetermined period of time Te.

Figure 6:
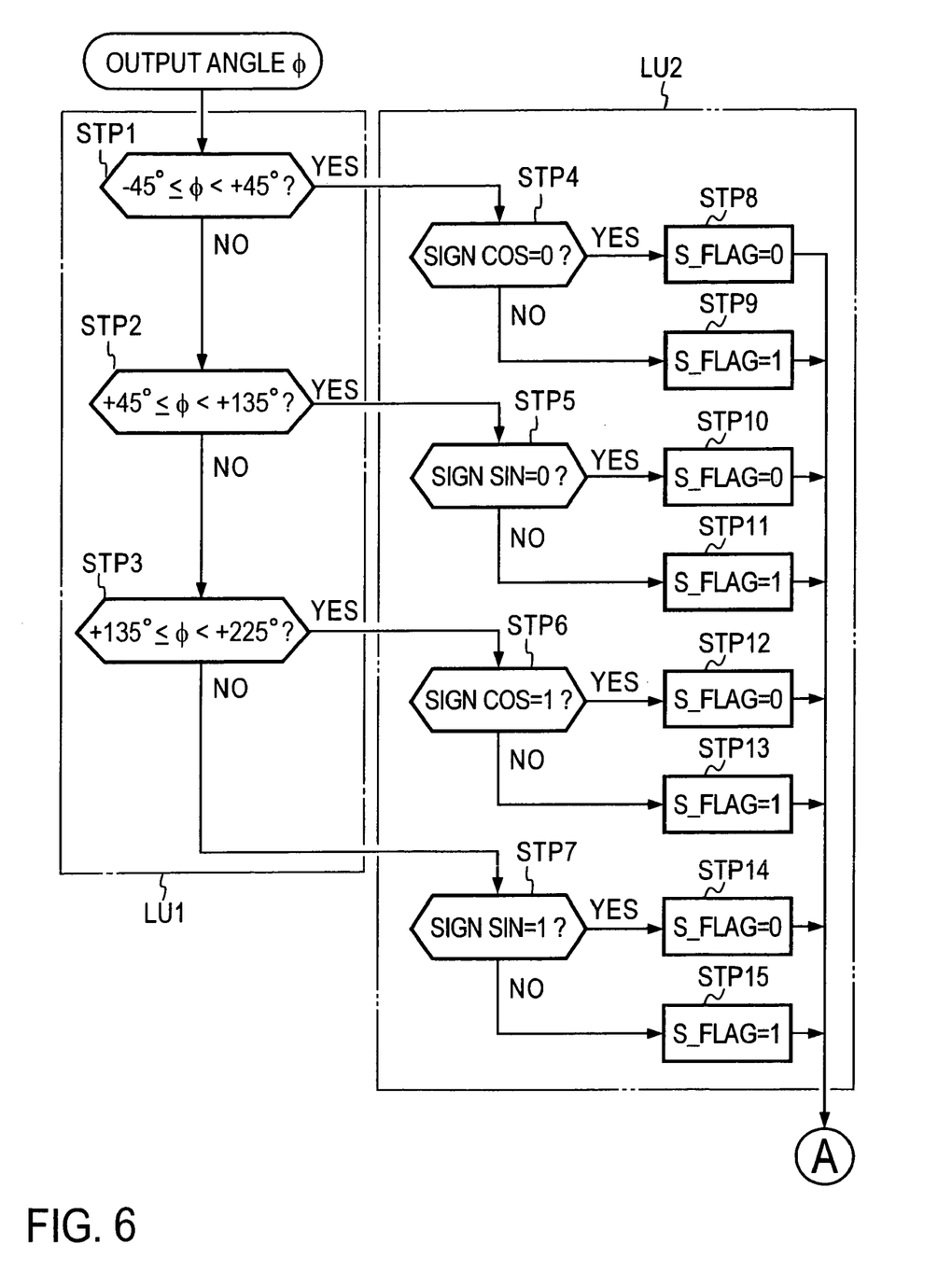
FIG. 6 is a flowchart for explaining one exemplary processing procedure of an output angle correcting section used in the embodiment of the invention.
Figure 7:
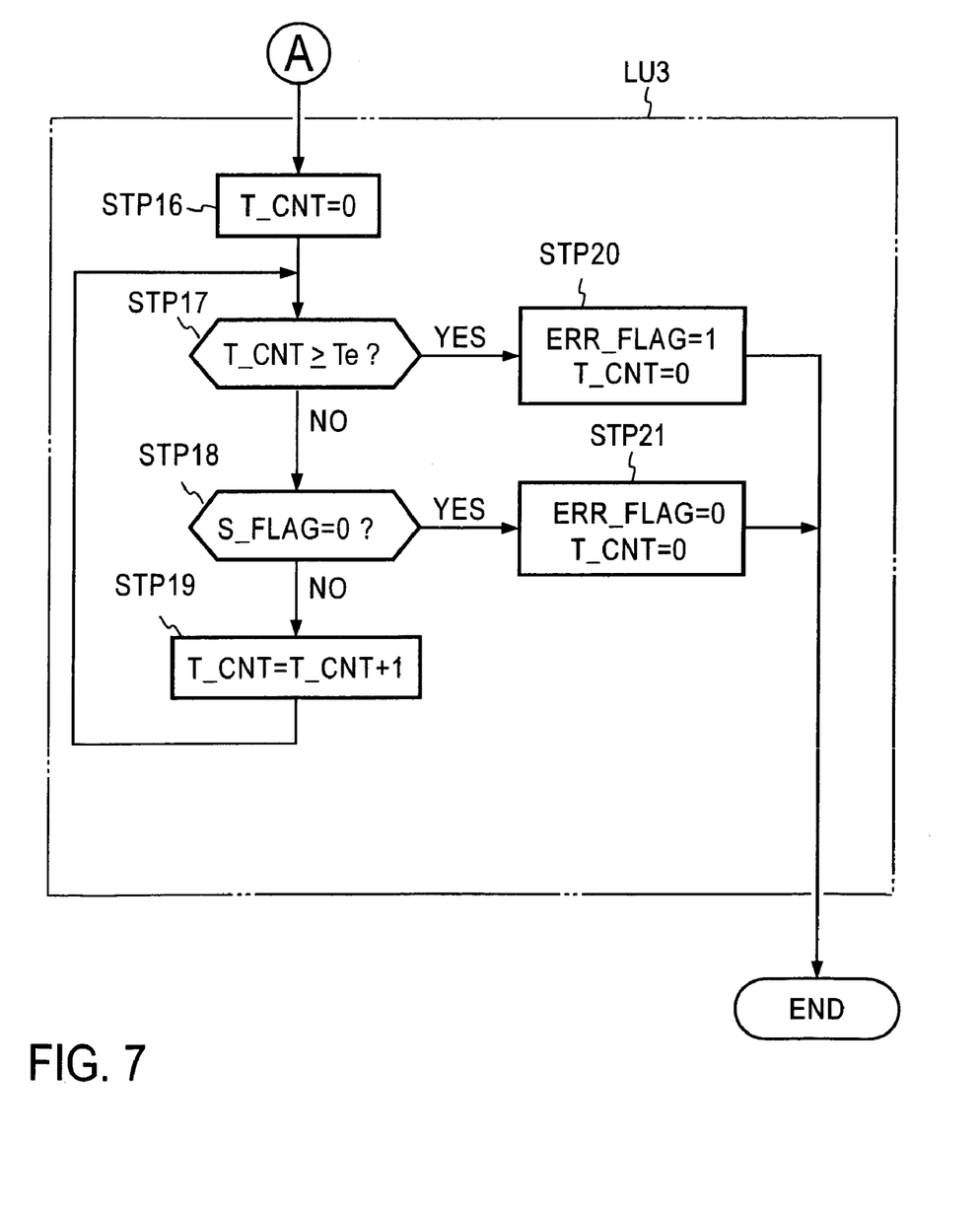
FIG. 7 is a flowchart for explaining the process continued from FIG. 6.

FIGS. 6 and 7 show procedures of the process of the output angle correcting section 42. As shown in FIGS. 6 and 7, the output angle correcting section 42 executes the procedures of Steps STP1 through STP22, whereby detecting the state where the angle error is excessive and correcting the output angle φ when that state is detected. Although it is possible to construct the output angle correcting section 42 by hardware, it may also be composed of an arithmetic processing unit such as a microcomputer. When the output angle correcting section 42 is composed of the arithmetic processing unit, the whole of the angular quadrant compensating section 40 including the detected signal sign judging section 41 described above and part of the RD converter 20' may also be implemented by the arithmetic processing unit. In this case, the rotation detection signals $S_1$ and $S_2$ are given as digital signals as a matter of course. For instance, the detected signal sign judging section 41 sequentially integrates the sample values of certain intervals on the waveform of the signal $S_1$ shown in FIG. 3A across the section of logic H by f(t)' so as to represent SUM_S1=SUM_S1+S1. The same applies also to the signal $S_2$. When the detected signal sign judging section 41 is composed of an analog circuit, it may be arranged so that the waveform of the signal $S_1$ shown in FIG. 3A is integrated by f(t)' across the section of logic H.

The process of the output angle correcting section 42 is roughly composed of an output angle region selecting routine LU1 and a quadrant comparison routine LU2 shown in FIG. 6 and an angle error excessive state judging routine LU3 shown in FIG. 7.

The output angle region selecting routine LU1 has judging processes Step STP1 through Step STP3 to select whether the output angle φ outputted from the counter 27 belongs to the angle region −45° to +45°, +45° to +135°, +135° to +225° or to the angle region (+225° to +315°) other than those regions in each judging process Steps STP1 through STP3.

The selection result of the output angle region selecting routine LU1 is passed to the quadrant comparison routine LU2. The angle region where the output angle φ exists is collated with the quadrant where the input angle θ judged by the detected signal sign judging section 41 exists in the quadrant comparison routine LU2. The comparing of the quadrant is carried out as follows.

When the output angle φ exists in the region of −45°≦φ<+45° for example, it is detected in the judging process Step STP1 and is branched to a judging process Step STP4 in the quadrant comparison routine LU2. A reference is made to a set value of the SIGN_COS flag set in the detected signal sign judging section 41 in the judging process Step STP4 of the quadrant comparison routine LU2. When a result of the judgment in the judging process Step STP4 is true, it is found that the input angle θ exists in the I or IV quadrant. If it is false, it is found that the input angle θ exists in the II or III quadrant (see FIG. 2).

When the result of judgment of the judging process Step STP4 is true, it is the case where there is no large deviation between the detected angle region of φ and the quadrant of θ. Then, the process is branched to Step STP8 to set 0 to the S_FLAG and advance to the angle error excessive state judging routine LU3. When the result of judgment by the judging process Step STP4 is false, this is a case where there is a large deviation between the detected angle region of φ and the quadrant of θ. Then, the process is branched to Step STP9 to set 1 to the S_FLAG and advance to the angle error excessive state judging routine LU3. That is, when the result of judgment by judging process Step STP4 is true, it can be decided that there is no excessive deviation between the region where the output angle φ exists and the quadrant where the input angle θ exists. In this case, S_FLAG=0 is set in Step STP8, indicating that the angle error (θ−φ) exists possibly in a range where the control response is high. When the result of judgment by the judging process Step STP4 is false, it is determined that the input angle θ exists on the outside of the two quadrants straddled by the region in which the output angle φ exists. In this case, S_FLAG=1 is set in Step STP9, indicating that the angle error (θ−φ) exists possibly in a range where the control response is low.

The value of the S_FLAG flag is passed to the angle error excessive state judging routine LU3 shown in FIG. 7. While the angle error excessive state judging routine LU3 ends without executing the correcting operation when the value of the S_FLAG flag is zero, it sets 1 to an ERR_FLAG flag and outputs an output angle correction request when the value of the S_FLAG flag is 1 and when that state continues for the predetermined period of time Te or longer. That is, when 1 is set to the ERR_FLAG flag, an angle correction signal is supplied from the output angle correcting section 42 to the counter 27 to phase-shift the value of the output angle φ by 180° by inverting a logical value of the most significant bit of the counter 27.

Specifically, a temporal count T_CNT is initialized to 0 in Step STP16. Then, it is judged in Step STP17 whether or not the temporal count T_CNT has become the value Te set in advance. If not, it is judged in Step STP18 whether or not S_FLAG=0. When it is not 0, i.e., when S_FLAG=1, the temporal count T_CNT is incremented by 1 in Step STP19 and the process returns to Step STP17. Accordingly, as long as S-FLAG=1 in Step STP19, the process of Steps STP17 through STP19 is repeatedly executed until when the temporal count T_CNT becomes equal to Te or more in Step STP17. Step STP17 branches to Step STP20 at a point of time when the temporal count T_CNT exceeds Te set in advance. Then, the temporal count T_CNT is reset to 0 and the ERR_FLAG flag is set to 1 to invert the logical value of the most significant bit of the counter 27 and to change the angle error that has existed in a range where the loop response is low to a range where the response is high. When S_FLAG=0 in Step STP18, the angle error exists in a range where the loop response is high, the temporal count T_CNT is reset to 0 and the ERR_FLAG is set to 0 to output the output angle φ of the counter 27 as it is.

While the case where the output angle φ exists in the region of $-45° \leq \phi < +45°$ has been explained above, the angle error excessive state can also be detected and the output value of the counter 27 can be corrected through a similar process in the case where the output angle φ exists in other regions.

EFFECT OF THE INVENTION

According to the invention, it is possible to provide the tracking loop type digital angle converter and the angle/digital converting apparatus having a high convergence which can avoid the principle problem that the relationship between the angular position of the object to be monitored and the output angle φ is left in the state deviating by 180° and avoid the range of low control response where the control deviation decreases in the angle error excessive state.

What is claimed is:

1. A tracking loop type digital angle converter for detecting an input angle θ by receiving rotation detection signals $S_1 = f(t)\sin\theta$ and $S_2 = f(t)\cos\theta$ from the input angle θ from a rotation detector excited by an exciting signal f(t) of a periodic function, comprising:

multiplying means for calculating $S_1 \cos\phi$ and $S_2 \sin\phi$ from the rotation detection signals $S_1$ and $S_2$ and the output signal φ;

subtracting means for calculating a difference $S_1\cos\phi - S_2\sin\phi = f(t)\sin(\theta-\phi)$ of these multiplication results;

synchronous detecting means for synchronously detecting the difference $f(t)\sin(\theta-\phi)$ to obtain a control deviation $\epsilon = \sin(\theta-\phi)$;

a voltage controlled oscillator for generating pulses of a frequency corresponding to the control deviation ε;

a counter for counting the pulses outputted from the voltage controlled oscillator to produce an output angle φ;

trigonometric function value generating means for outputting cos φ and sin φ corresponding to the output angle φ and negatively feeding back the cos φ and sin φ to the multiplying means;

a detected signal sign judging section for receiving the rotation detection signals $S_1$ and $S_2$ and judging plus and minus signs of sin θ and cos θ of the rotation detection signals $S_1$ and $S_2$; and an output angle correcting section for detecting a quadrant of the input angle θ from the signs of sin θ and cos θ outputted from the detected signal sign judging section, detecting an angle error between θ and φ, deciding whether or not the angle error is larger than a predetermined value, and if so, phase-shifting the output angle φ by 180°.

2. The angle/digital converting apparatus of claim 1, wherein said output angle correcting section is configured such that when the angle error is determined larger than the predetermined value, a logical value of a most significant bit of a digital signal representing the output angle φ outputted from the counter is inverted to thereby phase-shift the output angle φ by 180°.

3. The angle/digital converting apparatus of claim 1, wherein said output angle correcting section is configured such that the phase shift is executed when the angle error is larger than the predetermined value for a predetermined length of time or longer.

4. An angle/digital converting apparatus, comprising:

a rotation detector that outputs rotation detection signals $S_1 = f(t)\sin\theta$ and $S_2 = f(t)\cos\theta$ of an input angle θ;

an exciting signal generator for supplying an exciting signal f(t) to the rotation detector; and the tracking loop type digital angle converter of any one of claims 1 to 3 that receives the rotation detection signals $S_1$ and $S_2$ to output a digital angle.

\* \* \* \* \*

UNITED STATES PATENT AND TRADEMARK OFFICE
CERTIFICATE OF CORRECTION

PATENT NO.        : 7,541,951 B2
APPLICATION NO.   : 12/072338
DATED             : June 2, 2009
INVENTOR(S)       : Hisashi Nishimura It is certified that error appears in the above-identified patent and that said Letters Patent is hereby corrected as shown below:

in column 8, line 24, "angle/digital converting apparatus" should be --tracking loop digital angle converter-- in column 8, line 31, "angle/digital converting apparatus" should be --tracking loop digital angle converter--

Signed and Sealed this
Thirty-first Day of May, 2011

David J. Kappos
*Director of the United States Patent and Trademark Office*